US011070106B2

(12) United States Patent
Kataoka et al.

(10) Patent No.: US 11,070,106 B2
(45) Date of Patent: Jul. 20, 2021

(54) ELECTRIC OIL PUMP

(71) Applicant: NIDEC TOSOK CORPORATION, Kanagawa (JP)

(72) Inventors: Shigehiro Kataoka, Kanagawa (JP); Yoshiyuki Kobayashi, Kanagawa (JP); Noriyuki Ikeda, Kanagawa (JP)

(73) Assignee: NIDEC TOSOK CORPORATION, Kanagawa (JP)

( * ) Notice: Subject to any disclaimer, the term of this patent is extended or adjusted under 35 U.S.C. 154(b) by 330 days.

(21) Appl. No.: 16/048,381

(22) Filed: Jul. 30, 2018

(65) Prior Publication Data
US 2019/0036415 A1    Jan. 31, 2019

(30) Foreign Application Priority Data

Jul. 31, 2017 (JP) .............................. JP2017-148716
Jul. 6, 2018 (JP) .............................. JP2018-128993

(51) Int. Cl.
*H02K 5/22* (2006.01)
*H01R 13/50* (2006.01)
(Continued)

(52) U.S. Cl.
CPC ............. *H02K 5/225* (2013.01); *H01R 12/71* (2013.01); *H01R 13/405* (2013.01); *H01R 13/50* (2013.01); *H01R 24/66* (2013.01); *H02K 7/14* (2013.01); *H05K 5/0069* (2013.01); *F04C 2210/206* (2013.01); *F04C 2240/30* (2013.01); *F04C 2240/803* (2013.01); *H02K 2203/09* (2013.01)

(58) Field of Classification Search
CPC ...... H02K 5/225; H02K 5/0069; H02K 3/522; H02K 2203/09; H01R 24/66; H01R 13/04; H01R 13/50; H01R 13/405; H01R 27/00; H01R 12/71; H01R 12/58; H05K 5/0069; F04C 2210/206; F04C 2240/803; F04C 2240/40; F04C 2240/30
See application file for complete search history.

(56) References Cited

U.S. PATENT DOCUMENTS

| 7,036,892 B2 * | 5/2006 | Suzuki | F04C 2/102 303/116.4 |
| 8,262,374 B2 * | 9/2012 | Nakazawa | B60S 1/48 417/423.7 |

(Continued)

FOREIGN PATENT DOCUMENTS

| JP | 2013217223 | 10/2013 |
| JP | 2017053323 | 3/2017 |

Primary Examiner — Nathan C Zollinger
(74) Attorney, Agent, or Firm — JCIPRNET

(57) ABSTRACT

An electric oil pump includes a motor unit having a shaft centered on a central axis that extends in an axial direction of the shaft and a pump unit which is disposed on a front side of the motor unit, is driven by the motor unit, and discharges oil. The motor unit includes a rotor that is fixed on a rear side of the shaft, a stator that is disposed outside the rotor in a radial direction, a resin housing in which the rotor and the stator are housed, and a connector assembly that is disposed outside the resin housing in the radial direction. The connector assembly is integrally molded with the resin housing. The pump unit includes a pump rotor installed to the shaft that protrudes from the motor unit and a pump housing in which the pump rotor is housed.

4 Claims, 8 Drawing Sheets

(51) Int. Cl.
    *H01R 12/71*     (2011.01)
    *H05K 5/00*     (2006.01)
    *H01R 24/66*     (2011.01)
    *H01R 13/405*     (2006.01)
    *H02K 7/14*     (2006.01)

(56) References Cited

U.S. PATENT DOCUMENTS

| | | | |
|---|---|---|---|
| 10,077,781 B2* | 9/2018 | Irie | F04D 29/588 |
| 10,125,776 B2* | 11/2018 | Humburg | F04D 25/06 |
| 2005/0012387 A1* | 1/2005 | Suzuki | H02K 5/128 |
| | | | 303/116.4 |
| 2009/0079280 A1* | 3/2009 | Terauchi | H02K 29/08 |
| | | | 310/71 |
| 2014/0054991 A1* | 2/2014 | Hyodo | F04C 15/008 |
| | | | 310/71 |
| 2015/0340919 A1* | 11/2015 | Murakami | H02K 5/225 |
| | | | 310/71 |
| 2015/0357886 A1* | 12/2015 | Ishizeki | H02K 5/225 |
| | | | 310/71 |
| 2016/0254719 A1* | 9/2016 | Pondelek | H02K 5/08 |
| | | | 310/54 |

* cited by examiner

ELECTRIC OIL PUMP

CROSS-REFERENCE TO RELATED APPLICATION

This application claims the priority benefits of Japan patent application serial no. 2017-148716, filed on Jul. 31, 2017, and Japan application serial no. 2018-128993, filed on Jul. 6, 2018. The entirety of each of the above-mentioned patent applications is hereby incorporated by reference herein and made a part of specification.

BACKGROUND

Technical Field

The present disclosure relates to an electric oil pump.

Description of Related Art

For example, in Japanese Laid-open Publication No. 2013-217223 and Japanese Laid-open Publication No. 2017-053323, an electric oil pump including a motor unit and a circuit board is described. A coil end of a coil that extends from a stator of the motor unit is electrically directly connected to one end side of the circuit board. In addition, the other end of the circuit board is electrically connected to a connector side terminal of a connecting connector provided in the motor unit. The connecting connector is connected to an external connector. Thus, when the external connector is connected to the connecting connector, the external connector and the circuit board can be electrically connected.

External connectors have various shapes. Thus, an external connector having a shape different from that of an external connector that can be connected to a connecting connector cannot be connected to the connecting connector. Therefore, an electric oil pump including a connecting connector that works with various external connectors is desired.

SUMMARY

An aspect of the present disclosure is to provide an electric oil pump in which a connecting connector including a connector side terminal electrically connected to a circuit board corresponds to external connectors having various shapes.

An exemplary first aspect of the present disclosure is an electric oil pump including a motor unit having a shaft centered on a central axis that extends in an axial direction of the shaft; and a pump unit which is disposed on one side of the motor unit in the axial direction, is driven by the motor unit via the shaft, and discharges oil, wherein the motor unit includes a rotor that is fixed on an other side of the shaft in the axial direction; a stator that is disposed outside the rotor in a radial direction of the rotor; a resin housing in which the rotor and the stator are housed; and a connector assembly that is positioned outside the resin housing in the radial direction, wherein the connector assembly is integrally molded with the resin housing, and wherein the pump unit includes a pump rotor installed on the shaft that protrudes from the motor unit to the one side in the axial direction; and a pump housing in which the pump rotor is housed.

According to the exemplary first aspect of the present disclosure, it is possible to provide an electric oil pump in which a connecting connector including a connector side terminal electrically connected to a circuit board corresponds to external connectors having various shapes.

The above and other elements, features, steps, characteristics and advantages of the present disclosure will become more apparent from the following detailed description of the embodiments with reference to the attached drawings.

DESCRIPTION OF THE EMBODIMENTS

Figure 1:
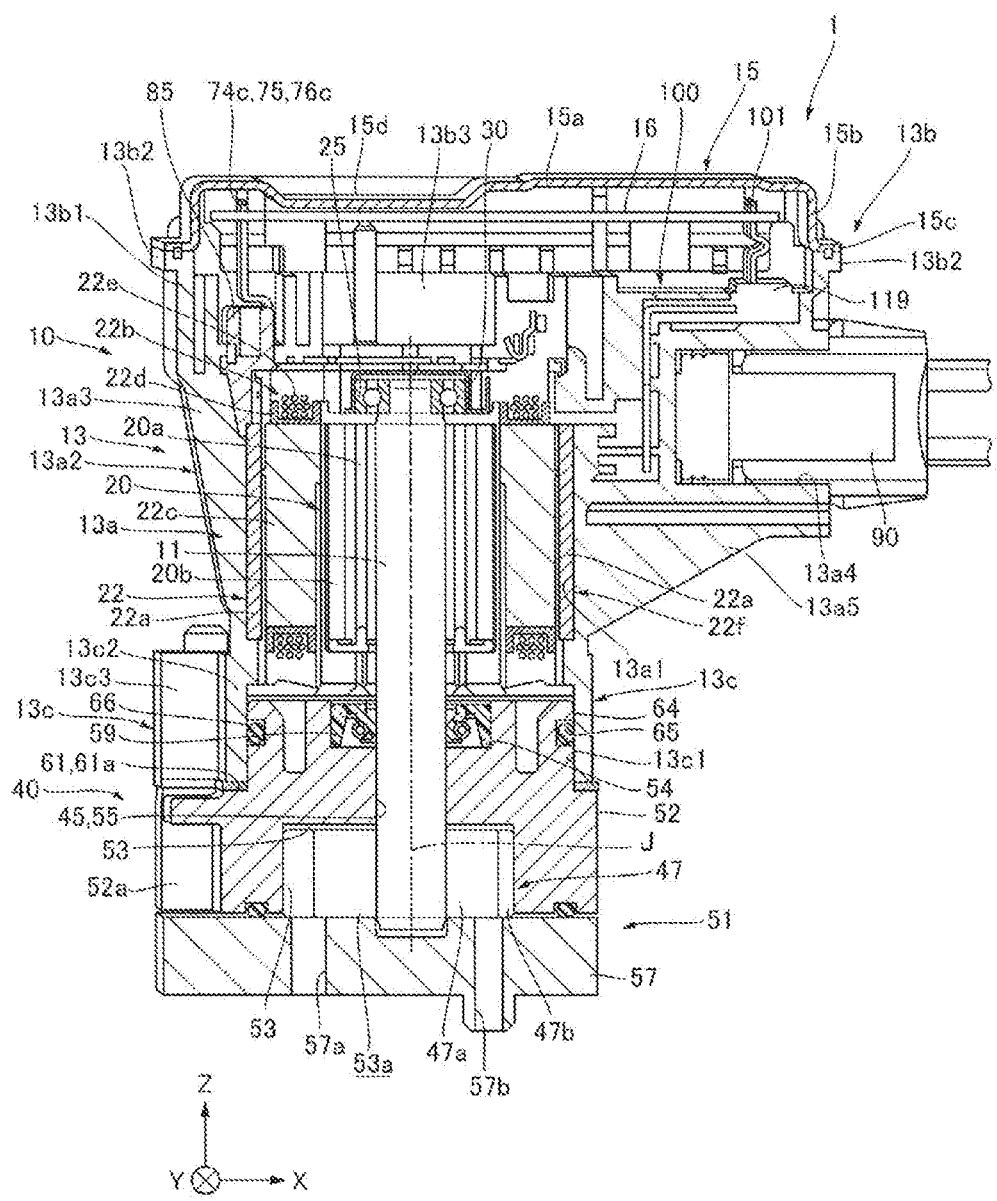
FIG. 1 is a cross-sectional view of an electric oil pump according to a first embodiment.

An electric oil pump according to an embodiment of the present disclosure will be described below with reference to the drawings. In the present embodiment, an electric oil pump in which a pump unit is disposed on one side of a motor in an axial direction and which discharges oil will be exemplified. In addition, in the following drawings, in order to allow respective configurations to be easily understood, actual structures and scales and numbers in the structures may vary.

In addition, in the drawings, an XYZ coordinate system is appropriately shown as a three-dimensional orthogonal coordinate system. In the XYZ coordinate system, a Z axial direction is a direction parallel to the other side of a central axis J shown in FIG. 1 in the axial direction. An X axial direction is a direction parallel to an electric oil pump shown in FIG. 1 in a transverse direction, that is, a left-right direction in FIG. 1. A Y axial direction is a direction orthogonal to both the X axial direction and the Z axial direction.

In addition, in the following description, the positive side (+Z side) in the Z axial direction will be referred to as "rear side" and the negative side (−Z side) in the Z axial direction will be referred to as "front side." Here, the rear side and the front side are terms that are simply used for explanation, and do not limit actual positional relationships and directions. In addition, unless otherwise noted, a direction (the Z axial direction) parallel to the central axis J is simply defined as an "axial direction," a radial direction around the central axis J is simply defined as a "radial direction," and a circumferential direction around the central axis J, that is, a circumference (θ direction) around the central axis J is simply defined as a "circumferential direction."

Here, in this specification, the term "extending in the axial direction" includes not only extending strictly in the axial direction (the Z axial direction) but also extending in a direction inclined in a range of less than 45° with respect to the axial direction. In addition, in this specification, the term "extending in the radial direction" includes not only extending strictly in the radial direction, that is, extending in a direction perpendicular to the axial direction (the Z axial direction), but also extending in a direction inclined in a range of less than 45° with respect to the radial direction.

<Overall Structure>

FIG. 1 is a cross-sectional view of an electric oil pump according to a first embodiment. As shown in FIG. 1, an electric oil pump 1 of the present embodiment includes a motor unit 10 and a pump unit 40. The motor unit 10 and the pump unit 40 are aligned in the axial direction. The motor unit 10 has a shaft 11 that is disposed along the central axis J that extends in the axial direction. The pump unit 40 is positioned on one side (front side) of the motor unit 10 in the axial direction and is driven by the motor unit 10 via the shaft 11 and discharges oil. Constituent members will be described below in detail.

<Motor Unit 10>

As shown in FIG. 1, the motor unit 10 includes a resin housing 13, a rotor 20, the shaft 11, a stator 22, a rolling bearing 25, and a connector assembly 100.

The motor unit 10 is, for example, an inner rotor type motor. The rotor 20 is fixed to an outer circumferential surface of the shaft 11. The stator 22 is positioned outside the rotor 20 in the radial direction. In addition, the rolling bearing 25 is disposed at a rear side (+Z side) end of the shaft 11 and rotatably supports the shaft 11.

(Resin Housing 13)

As shown in FIG. 1, the resin housing 13 includes a stator holding part 13a, a circuit board holding part 13b, and a pump body holding part 13c. The stator holding part 13a, the circuit board holding part 13b, and the pump body holding part 13c are integrally molded using a resin.

(Stator Holding Part 13a)

The stator holding part 13a has a through-hole 13a1 that extends inwardly in the axial direction. The shaft 11 of the motor unit 10, the rotor 20, and the stator 22 are disposed in the through-hole 13a1. An outer surface of the stator 22, that is, an outer surface of a core back part 22a to be described below, is fitted to an inner surface of the stator holding part 13a. Thereby, the stator 22 is housed in the stator holding part 13a.

The left side of an outer wall 13a2 of the stator holding part 13a of the present embodiment in the X axial direction has a left side wall 13a3 whose thickness in the radial direction of the resin increases from the front side (−Z side) toward the rear side (+Z side). In addition, the right side of the outer wall 13a2 in the X axial direction has an insertion hole 13a4 which extends in the X axial direction and into which an external connector 90 is inserted. A bracket part 13a5 that supports the insertion hole 13a4 is provided on the rear side of the insertion hole 13a4. The rigidity of the insertion hole 13a4 is strengthened by the bracket part 13a5.

(Circuit Board Holding Part 13b)

As shown in FIG. 1, the circuit board holding part 13b is continuously connected to the rear side end of the stator holding part 13a. The circuit board holding part 13b has a bottomed container shape of which the rear side opens and which extends in the X axial direction and includes a container body part 13b1 and a container body side flange part 13b2.

The container body part 13b1 has a substrate housing chamber 13b3. The rear side of the substrate housing chamber 13b3 opens, and a rear side opening of the substrate housing chamber 13b3 is covered by a cover part 15. The container body part 13b1 is integrally molded using a resin. A circuit board 16, motor side terminal parts 74c, 75c, and 76c, a connector side terminal 101, and the like are housed in the substrate housing chamber 13b3.

The motor side terminal parts 74c, 75c, and 76c are disposed on the left side in the X axial direction in the substrate housing chamber 13b3, one end side is electrically connected to a coil 22b of the motor unit 10, and the other end side is electrically connected to the circuit board 16. The connector side terminal 101 is disposed on the right side in the X axial direction in the substrate housing chamber 13b3, one end side is electrically connected to the external connector 90, and the other end side is electrically connected to the circuit board 16.

Figure 3:
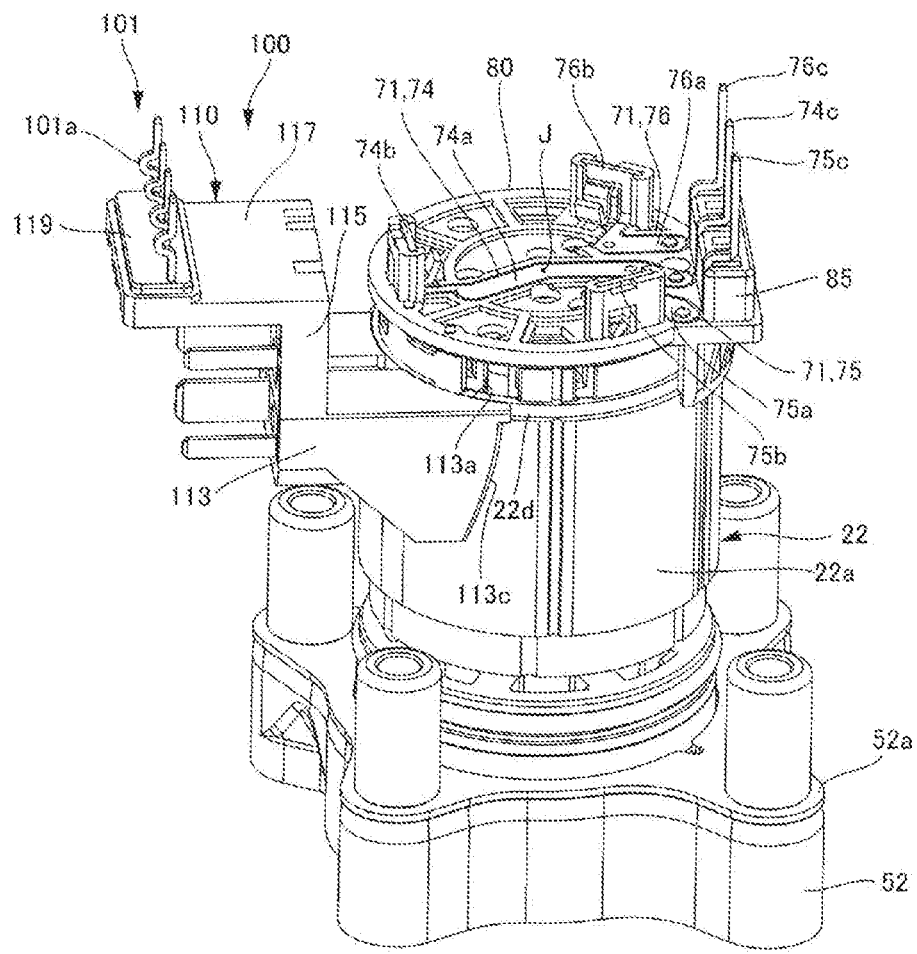
FIG. 3 is a perspective view of the connector assembly provided in the motor unit according to the first embodiment when viewed from the other side in the Y axial direction.

FIG. 3 is a perspective view of the connector assembly 100 provided in the motor unit 10 according to the present embodiment when viewed from the other side in the Y axial direction. As shown in FIG. 3, the motor side terminal parts 74c, 75c, and 76c constitute a part of a bus bar 71. The bus bar 71 is made of a metal material. The bus bar 71 is placed on a bus bar holder 80 and includes a first bus bar 74, a second bus bar 75, and a third bus bar 76.

The first bus bar 74 includes a bus bar body part 74a, a coil side terminal part 74b connected to one end side of the bus bar body part 74a, and the motor side terminal part 74c connected to the other end side of the bus bar body part 74a. Like the first bus bar 74, the second bus bar 75 includes a bus bar body part 75a, a coil side terminal part 75b, and the motor side terminal part 75c. Like the first bus bar 74, the third bus bar 76 includes a bus bar body part 76a, a coil side terminal part 76b, and the motor side terminal part 76c. The coil 22b (refer to FIG. 1) from the stator 22 is connected to the motor side terminal parts 74c, 75c, and 76c.

The bus bar holder 80 is disposed at a position that is coaxial with the central axis J of the shaft 11 and orthogonal to the central axis J. The bus bar holder 80 is disposed on the rear side (+Z side) end of the stator 22.

A shown in FIG. 1, the circuit board 16 outputs a motor output signal. In the present embodiment, the circuit board 16 is disposed on the rear side of the substrate housing chamber 13b3 and extends in the X axial direction. A plurality of electronic components and a print wiring (not shown) are provided on the back surface (front side surface) of the circuit board 16. Tips of the motor side terminal parts 74c, 75c, and 76c protrude and are electrically connected to the left side of the circuit board 16 in the X axial direction. In the present embodiment, the three motor side terminal parts 74c, 75c, and 76c are connected to the circuit board 16 at intervals in the Y axial direction. In addition, when a copper inlay substrate is used as the circuit board 16, heat generated in a heating element (not shown) can be dissipated through the cover part 15.

The cover part 15 is made of a metal material, and since it has a large thermal capacity and has a surface area, a heat dissipation effect is strong. In the present embodiment, the cover part 15 includes a top part 15a that extends along the circuit board 16, a side wall 15b that extends from the outer edge of the top part 15a to the front side, and a cover side flange part 15c that protrudes outwardly from the front side end of the side wall 15b.

The cover side flange part 15c is disposed to face the container body side flange part 13b2 provided in the container body part 13b1, and is fixed to the container body side flange part 13b2 by a fastening unit such as a bolt. The top part 15a has a recess 15d that is depressed toward the circuit board 16 on the left side in the X axial direction. A tip of the recess 15d is in contact with the circuit board 16 with a heat transfer member (not shown) therebetween. Thus, heat generated from the circuit board 16 can be effectively dissipated through the heat transfer member and the cover part 15.

(Pump Body Holding Part 13c)

The pump body holding part 13c has a tubular shape of which the front side opens, and is continuously connected to the front side end of the stator holding part 13a. The pump body holding part 13c has a hole 13c1 that extends inwardly in the axial direction. The inner diameter of the hole 13c1 has a size that is slightly larger than the outer diameter on the rear side of a pump body 52 of the pump unit 40 to be described below. The rear side of the pump body 52 is fitted to the inner surface of the hole 13c1.

As shown in FIG. 1, a pump housing 51 has a step 61 that is recessed inwardly in the radial direction of the pump housing 51 on the radially outer outside surface. The front side end of the resin housing 13 is fixed to the step 61. In the shown embodiment, the step 61 that is recessed inwardly in the radial direction is provided in a ring shape on a rear side surface of the pump body 52.

An outer surface 13c2 of the pump body holding part 13c includes a motor side flange part 13c3 that protrudes in the radial direction. The motor side flange part 13c3 is disposed to face a pump side flange part 52a provided in the pump body 52 to be described below, and is fixed to the pump side flange part 52a by a fastening unit such as a bolt. Thereby, the pump unit 40 is fixed to the resin housing 13.

(Rotor 20)

The rotor 20 includes a rotor core 20a and a rotor magnet 20b. The rotor core 20a surrounds the shaft 11 around the axis (θ direction) and is fixed to the shaft 11. The rotor magnet 20b is fixed to the outer surface along the axis (θ direction) of the rotor core 20a. The rotor core 20a and the rotor magnet 20b rotate together with the shaft 11. Here, the rotor 20 may be an embedded magnet type in which a permanent magnet is embedded in the rotor 20. Compared to a surface magnet type in which a permanent magnet is provided on a surface of the rotor 20, the rotor 20 of the embedded magnet type can reduce a likelihood of the magnet peeling off due to a centrifugal force, and can utilize a reluctance torque positively.

(Stator 22)

The stator 22 surrounds the rotor 20 around the axis (θ direction), and rotates the rotor 20 around the central axis J. The stator 22 includes the core back part 22a, a tooth part 22c, the coil 22b, and an insulator (bobbin) 22d.

The shape of the core back part 22a is a cylindrical shape concentric with the shaft 11. The tooth part 22c extends from the inner surface of the core back part 22a toward the shaft 11. A plurality of tooth parts 22c are provided and are disposed at uniform intervals in the circumferential direction on the inner surface of the core back part 22a. The coil 22b is provided around the insulator (bobbin) 22d and is formed by winding a conductive wire 22e. An insulator (bobbin) 19 is installed to each of the tooth parts 22c. The stator 22 includes a resin molded part 22f in which the core back part 22a, the tooth part 22c, the coil 22b, and the insulator (bobbin) 22d are covered with a resin when integral molding using a resin is performed.

(Rolling Bearing 25)

The rolling bearing 25 is disposed on the rear side (+Z side) of the rotor 20 and the stator 22 and is held by a rolling bearing holding part 30. The rolling bearing 25 supports the shaft 11. The shape, the structure, and the like of the rolling bearing 25 are not particularly limited, and any known bearing can be used.

(Shaft 11)

As shown in FIG. 1, the shaft 11 extends along the central axis J and penetrates through the motor unit 10. The front side (−Z side) of the shaft 11 protrudes from the motor unit 10 and extends into the pump unit 40. The front side (−Z side) of the shaft 11 is supported by a sliding bearing 45 in the pump body 52 to be described below.

(Connector Assembly 100)

Figure 2:
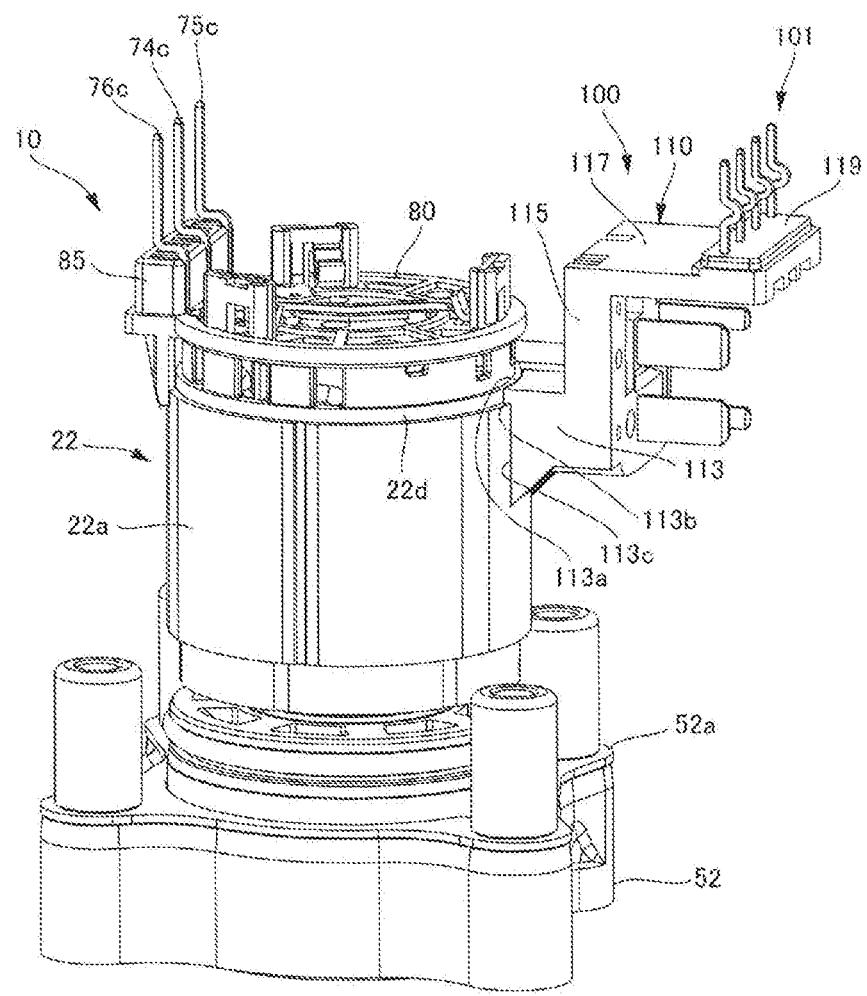
FIG. 2 is a perspective view of a connector assembly provided in a motor unit according to the first embodiment when viewed from one side in a Y axial direction.

FIG. 2 is a perspective view of the connector assembly 100 provided in the motor unit according to the present embodiment when viewed from one side in the Y axial direction. As shown in FIG. 2, the connector assembly 100 includes the connector side terminal 101 including one end side that is connected to the circuit board 16 and the other end side that is connected to the external connector 90 positioned outside the resin housing 13 and a connector body part 110 that holds the connector side terminal 101. The connector assembly 100 is integrally molded with the resin housing 13. In the present embodiment, the connector assembly 100 is integrally molded with the connector side terminal 101. That is, the connector assembly 100 is a primary molded article and the resin housing 13 including the connector assembly 100 is a secondary molded article.

In the shown embodiment, the connector body part 110 includes a first plate part 113 of which a tip is disposed to face the outer circumferential surface on the other side of the stator 22 in the axial direction and which extends to the outside in the radial direction, a connecting plate part 115 which is connected to the outer end of the first plate part 113 in the radial direction and extends to the other side in the axial direction, and a second plate part 117 which is connected to the other side end of the connecting plate part 115 in the axial direction and extends to the outside in the radial direction.

FIG. 2 and FIG. 3 are perspective views of the connector assembly 100 provided in the motor unit 10 according to the present embodiment when viewed from the other side in the Y axial direction. As shown in FIG. 3, one side end of the first plate part 113 in the X axial direction has a curved surface part 113a that is in contact with the outer circumferential surface of the insulator 22d that protrudes from the inner side of the stator 22 in the radial direction to the other side in the axial direction. A connector side step 113b that is recessed to the right side in the X axial direction is provided at the front side end of the curved surface part 113a. The connector side step 113b is in contact with the rear side end of the stator 22. Therefore, it is possible to position the connector assembly 100 in the axial direction with respect to the stator 22. In addition, a contact surface part 113c that is in contact with the outer circumferential surface of the stator 22 is provided on the front side from the right side end of the connector side step 113b in the X axial direction. Therefore, it is possible to position the connector assembly 100 in the radial direction with respect to the insulator 22d.

Figure 4:
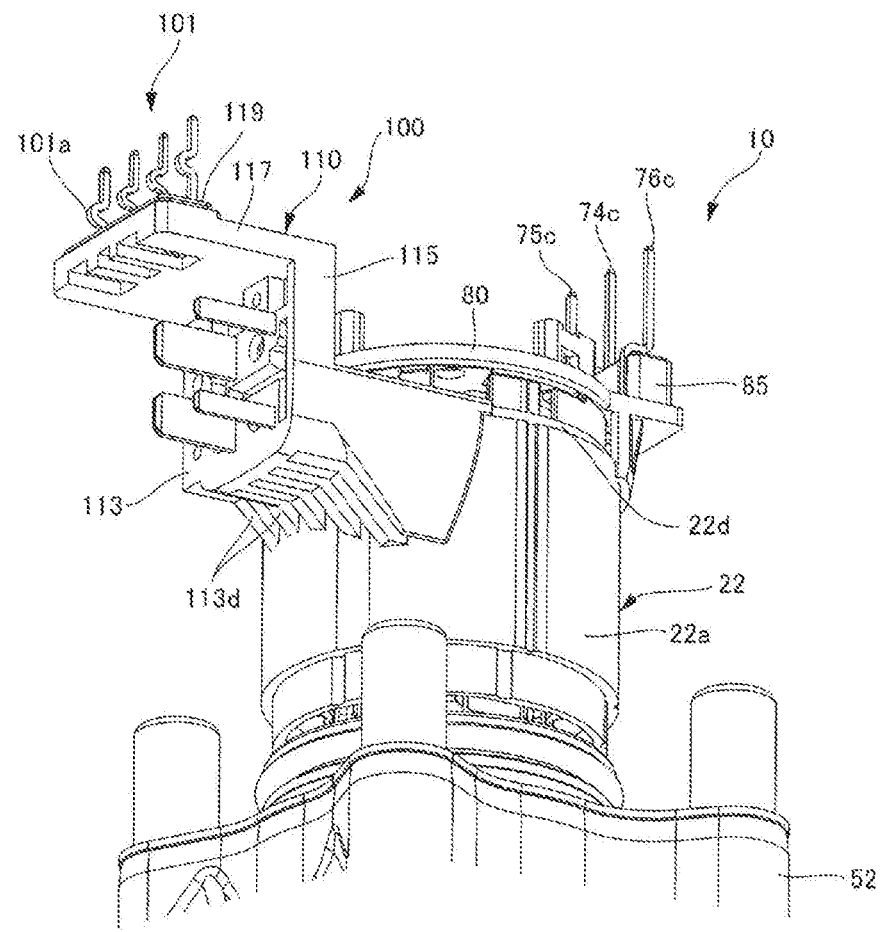
FIG. 4 is a perspective view of the connector assembly provided in the motor unit according to the first embodiment when viewed from the oblique front side.

FIG. 4 is a perspective view of the connector assembly 100 provided in the motor unit 10 according to the first embodiment when viewed from the oblique front side. As shown in FIG. 4, the first plate part 113 of the connector body part 110 has a rib 113d that extends to one side in the axial direction with respect to the curved surface part 113a and is in contact with the outer circumferential surface of the stator 22, and protrudes outwardly in the radial direction. In the shown embodiment, a plurality of ribs 113d are provided in the circumferential direction of the first plate part 113.

Therefore, the rigidity of the first plate part in the axial direction can be strengthened by the rib 113d.

Figure 5:
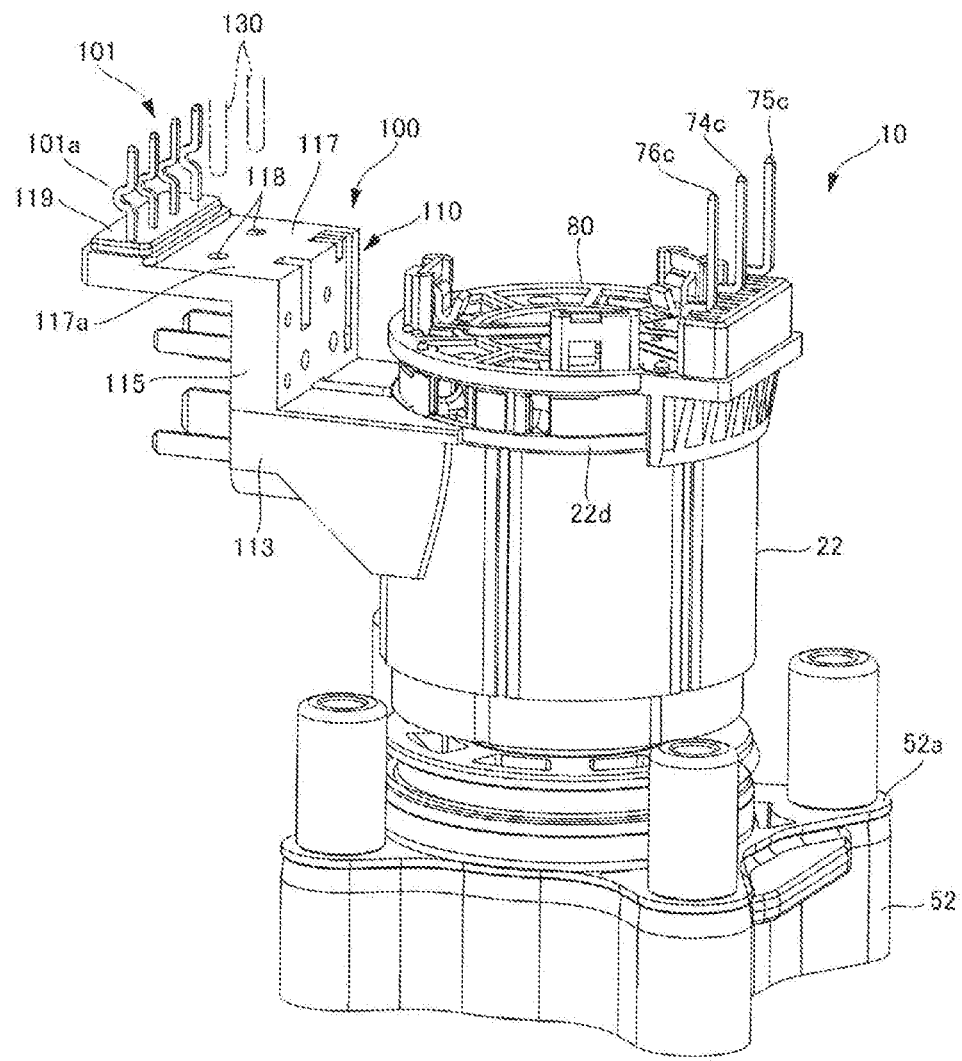
FIG. 5 is a perspective view of the connector assembly according to the first embodiment when viewed from the other side in the Y axial direction.

FIG. 5 is a perspective view of the connector assembly 100 according to the present embodiment when viewed from the other side in the Y axial direction. As shown in FIG. 1 and FIG. 5, the connector body part 110 has a surface part 117a that is positioned on one side in the axial direction with respect to the circuit board 16 housed in the substrate housing chamber 13b3 and extends along one side surface of the circuit board 16 in the axial direction. In the present embodiment, the second plate part 117 includes the surface part 117a on the rear side. The surface part 117a has a through-hole 118 that opens to the other side in the axial direction. The through-hole 118 has an inner diameter at which it can be fitted to a pin 130 of a mold for positioning the connector assembly 100 with respect to the resin housing 13.

The rear side of the through-hole 118 opens in the vicinity of the central part of the surface part 117a. Two through-holes 118 are provided at intervals. When the pin 130 of a mold is fitted into these through-holes 118, during integral molding, it is possible to position the connector assembly 100 in the X axial direction and the Y axial direction with respect to the resin housing 13.

The second plate part 117 includes a terminal support 119 that protrudes to the rear side on the left side in the X axial direction on the surface part 117a. The terminal support 119 has a rectangular parallelepiped shape and a longitudinal direction of the terminal support 119 extends in the Y axial direction.

The connector side terminal 101 that protrudes from the terminal support 119 to the other side in the axial direction includes a bent part 101a that is bent in a direction crossing a protrusion direction at an intermediate part of the connector side terminal 101 in the longitudinal direction. In the shown embodiment, the bent part 101a is provided at the intermediate part of the connector side terminal 101 that protrudes from the terminal support 119 in the axial direction. The bent part 101a has a U-shape that protrudes to the left side in the X axial direction. Here, the shape of the bent part 101a is not limited to a U-shape, and may be a V-shape that protrudes to the left side in the X axial direction.

If heat is transmitted to the connector side terminal 101 when a tip of the connector side terminal 101 is welded to the circuit board 16, there is a possibility that the connector side terminal 101 may extend and be deformed and the circuit board 16 may become biased. Therefore, when the bent part 101a is provided in the connector side terminal 101, extension of the connector side terminal 101 can be absorbed by the bent part 101a and biasing of the circuit board 16 can be reduced.

Figure 7:
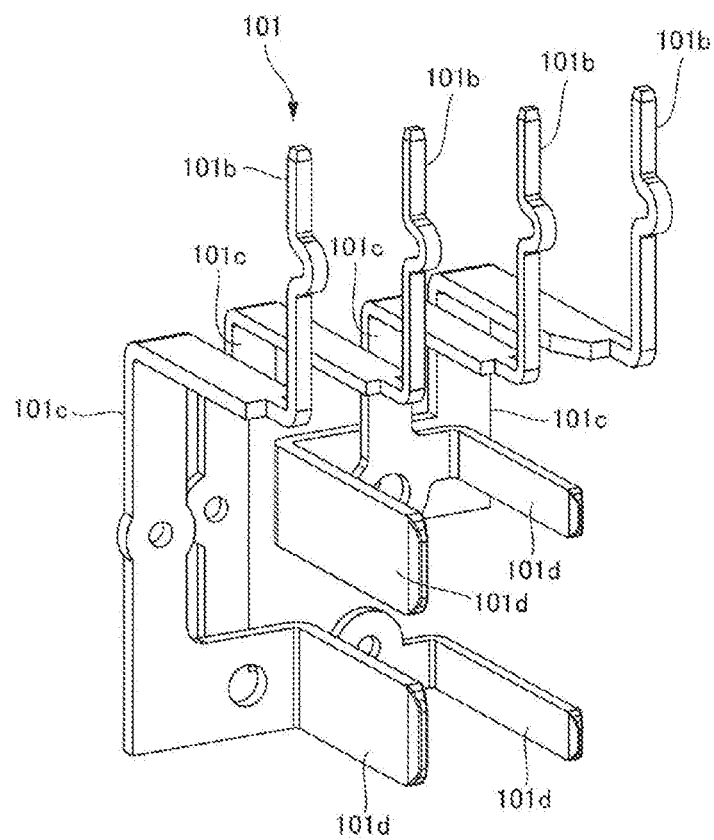
FIG. 7 is a perspective view of a terminal part according to the first embodiment.

FIG. 7 is a perspective view of the connector side terminal 101 according to the present embodiment. The connector side terminal 101 includes a substrate side connection terminal part 101b, a terminal body part 101c, and a connection terminal part 101d. The substrate side connection terminal part 101b extends in the axial direction. The connection terminal part 101d extends in the X axial direction. The terminal body part 101c that connects the substrate side connection terminal part 101b and the connection terminal part 101d extends at least in the axial direction. The connector side terminals 101 are disposed at intervals in the Y axial direction. In the shown embodiment, four connector side terminals 101 are disposed. The connector body part 110 and the connector side terminal 101 are integrally molded using a resin. Therefore, the connector side terminal 101 can be disposed with respect to the connector body part 110 with high positional accuracy.

As shown in FIG. 1, in an integrally molded article in which the connector assembly 100 is integrally molded with the resin housing 13, within the connector body part 110, a terminal holding part 85 that holds the coil side terminal parts 74b, 75b, and 76b and the terminal support 119 from which the connector side terminal 101 protrudes are exposed from the resin housing 13, and a surface of the connector body part 110 is covered with the resin housing 13. Therefore, a part of the connector assembly 100 exposed from the resin housing 13 can be reduced in size. Thus, it is possible to prevent water, air, and the like from entering an interface between the connector assembly 100 and the resin housing.

<Pump Unit 40>

As shown in FIG. 1, the pump unit 40 is positioned on one side of the motor unit 10 in the axial direction, and specifically, on the front side (−Z side). The pump unit 40 is driven by the motor unit 10 via the shaft 11. The pump unit 40 includes a pump rotor 47 and the pump housing 51. The pump housing 51 includes the pump body 52 and a pump cover 57. These components will be described below in detail.

(Pump Body 52)

The pump body 52 is fixed to the front side (−Z side) of the resin housing 13 on the front side (−Z side) of the motor unit 10. The pump body 52 includes a housing part 53 in which the pump rotor 47 is housed and has a side surface and a bottom that is positioned on the rear side (+Z side) of the motor unit 10. The housing part 53 opens to the front side (−Z side) and is recessed to the rear side (+Z side). The shape of the housing part 53 when viewed in the axial direction is a circular shape.

The pump body 52 has a recess 54 that is depressed from a rear side (+Z side) surface to the front side (−Z side). A sealing member 59 is housed in the recess 54. The shape of the recess 54 when viewed in the axial direction is a circular shape.

The pump body 52 has a through-hole 55 that penetrates along the central axis J. In the through-hole 55, both ends in the axial direction open and pass through the shaft 11, an opening on the rear side (+Z side) opens to the recess 54, and an opening on the front side (−Z side) opens to the housing part 53. The through-hole 55 functions as the sliding bearing 45 that rotatably supports the shaft 11.

The pump body 52 has the step 61 that is recessed inwardly in the radial direction on the outer side surface in the radial direction of the rear side (+Z side). The step 61 has an end wall surface 61a having a ring shape. When a front side end 13d of the resin housing 13 is brought into contact with the end wall surface 61a, it is possible to position the resin housing 13 with respect to the pump body 52 in the axial direction.

A circumferential wall surface 64 continuously extends to the rear side (+Z side) at the inner end of the end wall surface 61a in the radial direction. An annular recess 65 that is recessed to the inner side in the radial direction is provided on the rear side (+Z side) of the circumferential wall surface 64. A sealing member 66 is provided in the recess 65. In the shown embodiment, an O-ring is provided in the recess 65.

The pump side flange part 52a is provided on the outer side in the radial direction from the end wall surface 61a of the step 61. The pump side flange part 52a continuously extends in continuation with the end wall surface 61a. In the present embodiment, the four pump side flange parts 52a are provided at intervals in the circumferential direction.

The pump side flange part 52a is disposed to face the motor side flange part 13c3 when the front side end 13d of the resin housing 13 is in contact with the step 61, and when the pump side flange part 52a and the motor side flange part 13c3 are fastened by a fastening unit such as a bolt, the motor unit 10 can be fixed to the pump unit 40.

Figure 8:
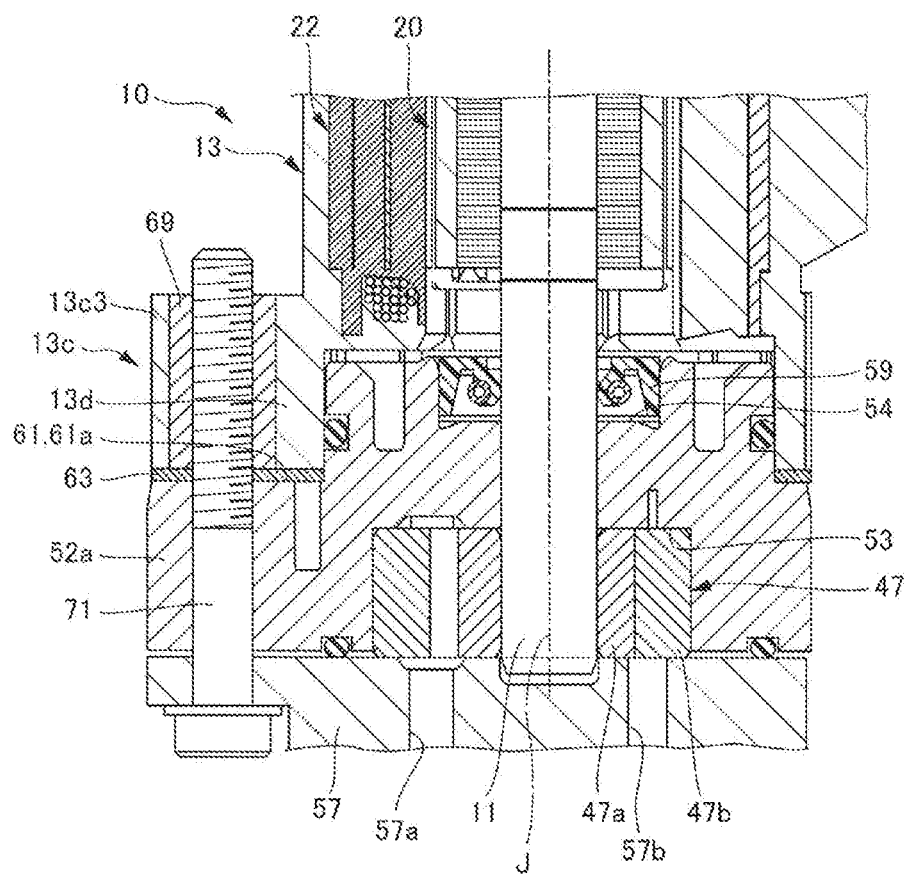
FIG. 8 is an enlarged cross-sectional view of a motor side flange part of a resin housing according to the first embodiment.

FIG. 8 is an enlarged cross-sectional view of the motor side flange part 13c3 of the resin housing 13 according to the present embodiment. In the present embodiment, as shown in FIG. 8, the front side end 13d of the resin housing 13 is in contact with the end wall surface 61a via a metal plate 63 disposed on the end wall surface 61a. The step 61 is positioned between the sealing member 59 provided in the recess 54 and the housing part 53.

In the present embodiment, the metal plate 63 is provided between the resin housing 13 and the pump body 52. In the resin housing 13, knurls are provided on the outer surface, and the collar 69 in which a female thread is provided on the inner circumferential surface is inserted thereinto, and specifically, is inserted onto the step 61. The metal plate 63 has a size substantially the same as the size of the front side end 13d of the resin housing 13 in the radial direction. The reason why the metal plate 63 is disposed between the resin housing 13 and the pump body 52 is as follows. The size of the external form of the resin housing 13 cannot be increased because of a relationship with an installation space of the electric oil pump 1. Therefore, the wall thickness of the collar 69 of the resin housing 13 that is in contact with the pump body 52 of the resin housing 13 cannot be sufficiently secured. Therefore, when the resin housing 13 and the pump body 52 are fastened, there is a possibility of the pump body 52 buckling. Therefore, when the metal plate 63 made of iron is placed between the resin housing 13 and the pump body 52, even if the wall thickness of the collar 69 is not sufficiently formed, buckling can be prevented even when the pump body 52 is made of aluminum.

(Pump Rotor 47)

The pump rotor 47 is installed to the shaft 11. More specifically, the pump rotor 47 is installed to the front side (−Z side) of the shaft 11. The pump rotor 47 includes an inner rotor 47a installed to the shaft 11 and an outer rotor 47b that surrounds the outer side of the inner rotor 47a in the radial direction. The inner rotor 47a has an annular ring shape. The inner rotor 47a is a gear having teeth on the outer surface in the radial direction.

The inner rotor 47a is fixed to the shaft 11. More specifically, the front side (−Z side) end of the shaft 11 is press-fitted into the inner rotor 47a. The inner rotor 47a rotates around the axis (θ direction) together with the shaft 11. The outer rotor 47b has an annular ring shape that surrounds the outer side of the inner rotor 47a in the radial direction. The outer rotor 47b is a gear having teeth on the inner surface in the radial direction.

The inner rotor 47a is engaged with the outer rotor 47b and when the inner rotor 47a rotates, the outer rotor 47b rotates. That is, the pump rotor 47 rotates according to rotation of the shaft 11. In other words, the motor unit 10 and the pump unit 40 have the same rotation axis. Thereby, it is possible to prevent the size of the electric oil pump 1 from becoming larger in the axial direction.

In addition, when the inner rotor 47a and the outer rotor 47b rotate, a volume between engaging parts of the inner rotor 47a and the outer rotor 47b changes. An area in which the volume decreases is a pressing area, and an area in which the volume increases is a negative pressure area. An intake port is disposed on the front side (−Z side) of the negative pressure area of the pump rotor 47. In addition, a discharge port is disposed on the front side (−Z side) of a pressing area Ap of the pump rotor 47. Here, oil sucked into the housing part 53 from an intake opening 57a provided in the pump cover 57 is stored in a volume part between the inner rotor 47a and the outer rotor 47b and is sent to the pressing area. Then, the oil passes through the discharge port and is discharged from a discharge opening 57b provided in the pump cover 57.

(Pump Cover 57)

As shown in FIG. 1, the pump cover 57 is covered from the front side (−Z side) with respect to the pump body 52, and thus the housing part 53 is provided between the pump cover 57 and the pump body 52. In the present embodiment, the pump cover 57 is installed to the front side (−Z side) of the pump body 52 and blocks an opening 53a that opens to the front side (−Z side) of the housing part 53, and thus the housing part 53 is provided between the pump cover 57 and the pump body 52.

<Operations and Effects of Electric Oil Pump 1>

Next, operations and effects of the electric oil pump 1 will be described. As shown in FIG. 1, when the motor unit 10 of the electric oil pump 1 is driven, the shaft 11 of the motor unit 10 rotates, and as the inner rotor 47a of the pump rotor 47 rotates, the outer rotor 47b also rotates. When the pump rotor 47 rotates, oil sucked from the intake opening 57a of the pump unit 40 moves through the housing part 53 of the pump unit 40, passes through the discharge port, and is discharged from the discharge opening 57b.

(1) Here, in the electric oil pump 1 according to the present embodiment, since the connector assembly 100 is integrally molded with the resin housing 13, a connector assembly according to a type of the external connector 90 can be integrally molded with the resin housing 13. Therefore, it is possible to provide the electric oil pump 1 that corresponds to various external connectors 90. In addition, it is possible to reduce the weight of the electric oil pump 1 compared to when a housing is made of a metal.

(2) Since the resin housing 13 includes the substrate housing chamber 13b3 which is positioned on the other side of the shaft 11 in the axial direction and in which the circuit board 16 is housed, it is possible to reduce the number of components compared to when the substrate housing chamber 13b3 is provided separately from the resin housing 13.

(3) Since the connector side step 113b of the connector body part 110 is in contact with the other side end of the stator 22 of the motor unit 10 in the axial direction, when integral molding (for example, insert molding) using a resin is performed, positioning of the connector body part 110 in the axial direction can be easily performed.

(4) Since the connector body part 110 includes the curved surface part 113a that is in contact with the outer circumferential surface of the insulator 22d, when integral molding (for example, insert molding) using a resin is performed, positioning of the connector body part 110 in the radial direction can be performed.

(5) Since the connector body part 110 has the rib 113d that extends to one side in the axial direction with respect to the curved surface part 113a and is in contact with the outer circumferential surface of the stator 22, and protrudes outwardly in the radial direction, it is possible to improve the rigidity of the connector body part 110 including the curved surface part 113a. Therefore, it is possible to prevent a possibility of a part of the connector body part 110 having the curved surface part 113a being deformed due to a resin pressure when integral molding using a resin is performed, and the curved surface part 113a can be reliably brought into contact with the outer circumferential surface of the stator 22.

(6) Since the surface part 117a has the through-hole 118 that opens to the other side in the axial direction and the through-hole 118 has an inner diameter at which it can be fitted to the pin 130 of a mold for positioning the connector body part 110 with respect to the resin housing 13, when the pin 130 is fitted into the through-hole 118 during integral molding, the connector body part 110 can be positioned with respect to the resin housing 13.

(7) Since the connector side terminal 101 that protrudes to the other side in the axial direction from the terminal support 119 includes the bent part 101a that is bent in a direction crossing a protrusion direction at an intermediate part of the connector side terminal 101 in the longitudinal direction, when heat is transmitted to the connector side terminal 101 when a tip of the connector side terminal 101 is welded to the circuit board 16, there is a possibility of the connector side terminal 101 extending and being deformed and the circuit board 16 being biased. Therefore, when the connector side terminal 101 includes the bent part 101a, extension of the connector side terminal 101 can be absorbed by the bent part 101a and biasing of the circuit board 16 can be reduced.

(8) In the integrally molded article in which the connector assembly 100 is integrally molded with the resin housing 13, since the coil side terminal parts 74b, 75b, and 76b that protrude from the terminal holding part 85 and the connector side terminal 101 that protrudes from the terminal support 119 are exposed from the resin housing 13, and a surface of the connector body part 110 is covered with the resin housing 13, a part of the connector assembly 100 exposed from the resin housing 13 can be reduced in size. Thus, it is possible to prevent water, air, and the like from entering an interface between the connector assembly 100 and the resin housing 13.

(9) Since the connector body part 110 includes the first plate part 113 that extends to the outside in the radial direction, the connecting plate part 115 that extends to the other side in the axial direction, and the second plate part 117 that extends to the outside in the radial direction, if a resin is cured after integral molding is performed, the resin is cured on both side surfaces in the axial direction of the first plate part 113 and the second plate part 117, and the resin is cured on both side surfaces of the connecting plate part 115 in the radial direction. Therefore, the connector body part 110 can be firmly fixed to the resin housing 13.

(10) Since the connector body part 110 and the connector side terminal 101 are integrally molded using a resin, it is possible to reduce the number of components and it is possible to easily produce the connector assembly 100, compared to when the connector side terminal 101 is provided separately in the connector body part 110.

(11) Since one side end of the resin housing 13 in the axial direction is fixed to the step 61, it is possible to perform fixing while the resin housing 13 is positioned with respect to the pump unit 40.

Modified Example of First Embodiment

Modified Example of Positioning When Connector Assembly is Molded

Figure 6:
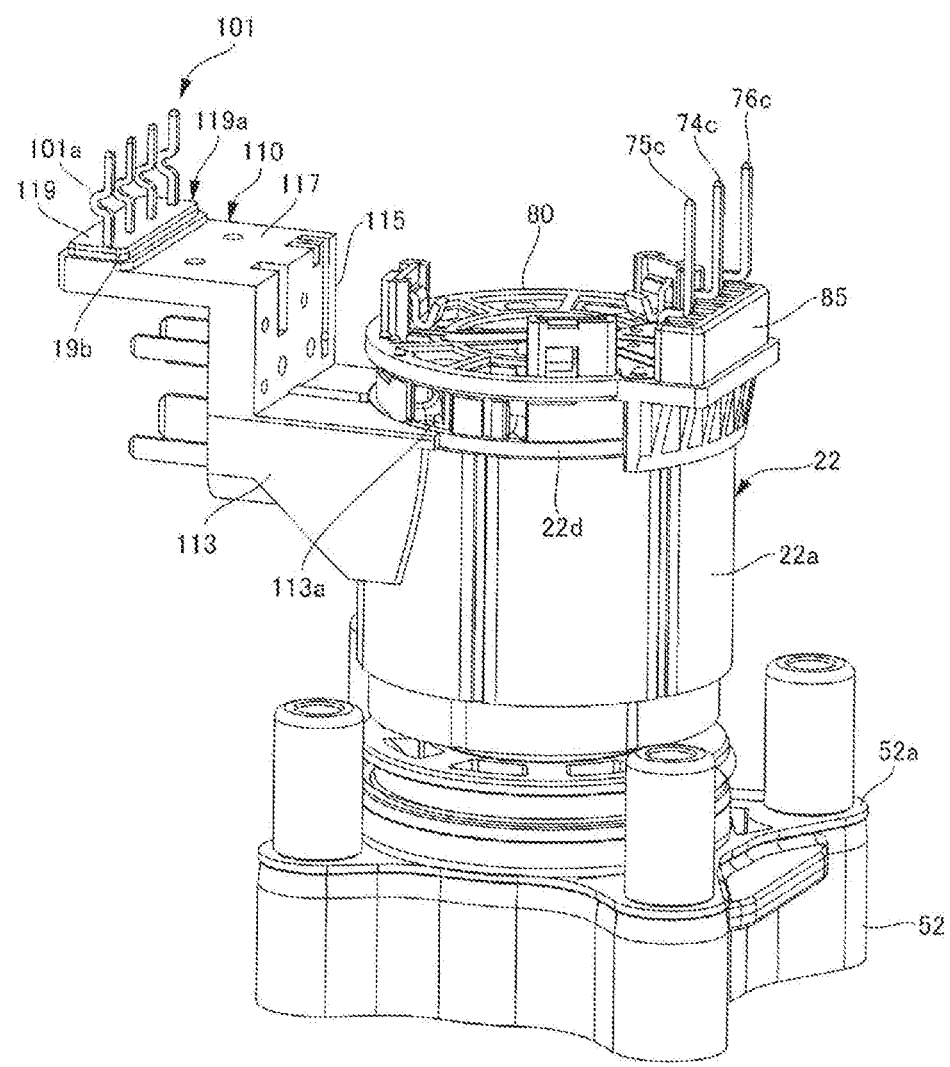
FIG. 6 is a perspective view of a connector assembly according to a modified example of the first embodiment when viewed from the other side in the Y axial direction.

In the rolling connector assembly 100 according to the first embodiment shown in FIG. 5, the first plate part 113 has the through-hole 118 that can be fitted to the pin 130 of a mold. However, the present disclosure is not limited to this structure. For example, as shown in FIG. 6, the terminal support 119 may have a fitting part 119a that can be fitted to a positioning part of a mold for positioning the connector body part 110 with respect to the resin housing 13. In the shown embodiment, in the terminal support 119, a side surface 19b around the terminal support 119 becomes the fitting part 119a and can be fitted to the positioning part of a mold. Therefore, when the fitting part 119a is fitted to the positioning part during integral molding, the connector body part 110 can be positioned with respect to the resin housing 13 (Modified Example 1).

While embodiments of the present disclosure have been described above, the present disclosure is not limited to such embodiments, and various modifications and alternations within the spirit and scope of the present disclosure can be made. These embodiments and modifications thereof are included in the spirit and scope of the present disclosure and also included in the scope of claims and equivalents thereof.

What is claimed is:

1. An electric oil pump comprising:
   a motor unit having a shaft centered on a central axis that extends in an axial direction of the shaft, wherein the axial direction includes a first axial direction and a second axial direction opposite to the first axial direction; and
   a pump unit which is disposed on the first axial direction of the shaft is driven by the motor unit via the shaft, and discharges oil,
   wherein the motor unit comprises
      a rotor that is fixed on the second axial direction of the shaft;
      a stator that is disposed outside the rotor in a radial direction of the rotor;
      a resin housing in which the rotor and the stator are housed, wherein the resin housing further comprises a substrate housing chamber being disposed on the second axial direction of the shaft and houses a circuit board;
      a connector assembly comprising a terminal part including one end side that is connected to the circuit board and the other end side that is connected to an external connector disposed outside the resin housing; and
      a connector body part holding the terminal part, wherein the connector assembly is integrally molded with the resin housing, and
   wherein the connector body part has a surface part that is disposed on the first axial direction with respect to the circuit board housed in the substrate housing chamber and extends along a surface of the circuit board on the first axial direction,
   wherein the other end side of the terminal part protrudes from the surface part,
   wherein the surface part has a terminal support that surrounds a periphery of a base part of the terminal part and protrudes from the surface part, and
   wherein the terminal support has a fitting part that is configured to be fitted to a positioning part of a mold for positioning the connector body part with respect to the resin housing,
   wherein the pump unit comprises
      a pump rotor installed on the shaft; and
      a pump housing in which the pump rotor is housed.

2. The electric oil pump according to claim 1,
   wherein the terminal part that protrudes from the terminal support to the second axial direction has a bent part that is bent in a direction crossing a protrusion direction at an intermediate part of the terminal part in a longitudinal direction.

3. The electric oil pump according to claim 2, wherein, in an integrally molded article in which the connector assembly is integrally molded with the resin housing, within the connector body part, the terminal support and the terminal part that protrudes from the terminal support are exposed from the resin housing, and a surface of the connector body part is covered with the resin housing.

4. The electric oil pump according to claim 1, wherein the connector body part and the terminal part are integrally molded using a resin.

* * * * *